United States Patent [19]

Polata et al.

[11] 4,003,076

[45] Jan. 11, 1977

[54] SINGLE BIPOLAR TRANSISTOR MEMORY CELL AND METHOD

[75] Inventors: Bohumil Polata, Los Altos; James A. Marley, Jr., Saratoga, both of Calif.

[73] Assignee: Signetics Corporation, Sunnyvale, Calif.

[22] Filed: May 5, 1975

[21] Appl. No.: 574,508

Related U.S. Application Data

[63] Continuation of Ser. No. 362,495, May 21, 1973, abandoned.

[52] U.S. Cl. ............................. 357/34; 307/238; 307/300; 307/319; 307/320; 357/14; 357/40; 357/51
[51] Int. Cl.² ........................................ H01L 29/72
[58] Field of Search .......... 307/238, 300, 319, 320; 357/14, 34, 40, 48, 51

[56] References Cited

UNITED STATES PATENTS

| | | |
|---|---|---|
| 3,581,164 | 5/1971 | Pfander et al. .................... 357/14 |
| 3,740,731 | 6/1973 | Ohwada et al. ..................... 357/14 |
| 3,740,732 | 6/1973 | Frandon ............................. 357/14 |
| 3,818,463 | 6/1974 | Grundy ............................. 307/238 |
| 3,876,992 | 4/1975 | Pricer ............................... 307/238 |

*Primary Examiner*—Michael J. Lynch
*Assistant Examiner*—Joseph E. Clawson, Jr.
*Attorney, Agent, or Firm*—C. Richard Pfeiffer; William H. Dana

[57] ABSTRACT

Single bipolar transistor memory cell in which information is stored on the collector to substrate capacitance. This capacitance may be enhanced by an additional diffused region. Storage and retrieval of information is accomplished through only two leads connected to the transistor which is operated so that a portion of the base is fully depleted during a portion of the operating memory cycle of the memory cell.

5 Claims, 10 Drawing Figures

SINGLE BIPOLAR TRANSISTOR MEMORY CELL AND METHOD

This is a continuation, of application Ser. No. 362,495 now abandoned filed May 21, 1973.

BACKGROUND OF THE INVENTION

One transistor memory cell has heretofore been disclosed as, for example, in an article entitled "Transient Selection Gates Using Breakdown" appearing in the IEEE Journal of Solid-State Circuits, Vol. SC-7, No. 5, October 1972. However, such memory cells have the disadvantage in that avalanche breakdown is utilized. In the device disclosed in the article, the capacitance associated with the emitter-base and base-collector junctions is utilized. It is believed that this is unsatisfactory because the avalanche breakdown can be a somewhat destructive process in that it decreases carrier lifetime and after repeated operation, the junction no longer has the characteristics that it had when it was first fabricated. There is, therefore, a need for a new and improved memory cell.

SUMMARY OF THE INVENTION AND OBJECTS

The single bipolar transistor memory cell consists of a semiconductor body of one conductivity type having a surface. An epitaxial layer is formed on the surface. A buried layer of the same conductivity type but of a greater concentration than the semiconductor body is formed in the semiconductor body and extends downwardly from the surface of the body. A base region is formed in the epitaxial layer which is defined by a generally dish-shaped PN junction extending to the surface of the epitaxial layer. An emitter region is formed within the base region and is defined by another dish-shaped PN junction extending to the surface of the epitaxial layer. A layer of insulating material overlies the surface of the epitaxial layer and metallization is provided on the surface of the insulating material and extends through the insulating material and makes contact only the emitter and the base regions of the semiconductor body.

In general, it is an object of the present invention to provide a memory cell which only requires the use of a single bipolar transistor for each memory cell.

Another object of the invention is to provide a memory cell of the above character which only requires two leads.

Another object of the invention is to provide a memory cell and method for making the same of the above character which is compatible with NPN bipolar processing techniques.

Another object of the invention is to provide a memory cell of the above character which only requires two leads for the external decoding and sensing circuitry to write and read data.

Another object of the invention is to provide a memory cell of the above character in which the information is stored on the collector to substrate capacitance.

Another object of the invention is to provide a memory cell and method of the above character in which a buried layer is provided which is used in the formation of the collector to substrate capacitance.

Another object of the invention is to provide a memory cell and method of the above character in which the substrate capacitance is enhanced by providing an additional diffused region in contact with the buried layer so that in effect two buried layers are provided.

Another object of the invention is to provide a memory cell and method of the above character in which the base is operated in a substantially fully depleted mode.

Another object of the invention is to provide a memory cell and method of the above character in which the collector to emitter reverse breakdown voltage is larger than the emitter to collector reverse breakdown voltage.

Another object of the invention is to provide a memory cell and method of the above character which is relatively simple.

Another object of the invention is to provide a memory cell and method of the above character which permits easy and economical fabrication of the memory cell.

Additional objects and features of the invention will appear from the following description in which the preferred embodiment is set forth in detail in conjunction with the accompanying drawing.

BRIEF DESCRIPTION OF PREFERRED EMBODIMENT

Figure 1:
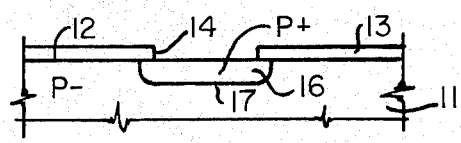
FIGS. 1–6 are cross-sectional views showing the manner in which a single bipolar transistor memory cell incorporating the present cell is fabricated.

The single bipolar transistor memory cell incorporating the present invention is fabricated utilizing the steps shown in FIGS. 1–7. Thus, as shown in FIG. 1, a semiconductor body 11 is provided which is formed of a suitable material such as P-type silicon typically having a resistance of 10 to 20 ohm cm. The semiconductor body is provided with a planar surface 12 on which there is grown a silicon dioxide layer 13 in a conventional manner. An opening 14 is formed in the oxide layer 13 to expose the surface 12 therebelow by conventional photolithographic techniques. A P-type impurity such as boron is then diffused through the openings 14 to provide a P+ region 16 defined by a dish-shaped PN junction extending to the surface 12 below the oxide layer 13.

After the P+ diffusion has been accomplished, the layer 13 can be removed and a new oxide layer 18 is grown on the surface 12. An opening 19 is formed in the oxide layer 18 to expose the surface 12 in an area overlying the P+ region 16 and which is larger than the P+ region 16. A suitable N-type impurity such as arsenic is then diffused through the opening 19 to provide an N++ region 21 which is larger in area in plan than the region 16 but which extends into the region 16 to a lesser depth than region 16 and is defined by a dish-shaped PN junction 22 which also extends to the surface 12 beneath the oxide layer 18. Thus, it can be seen that the N++ layer 21 overlays the P+ region 16 so that there in effect is provided a P+N++ junction to form a diode structure which is utilized to increase capacitance that is used for the storage of information as hereinafter described. The P+ region 16 should be substantially as large or larger than the device with which it is to operate. Although the region 21 has been shown as being larger than the region 16, it should be appreciated that, if desired, the region 21 can be smaller. The principal objective is to provide a PN junction between the P+ region and the N++ region which is maximum in size to maximize the capacitance. In other words, the intersection between the P+ and N++ regions 16 and 21 should be as large as possible.

Figure 2:
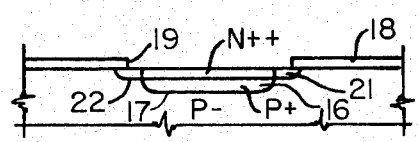
Figure 3:
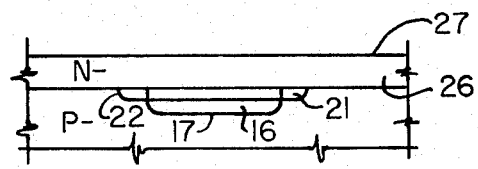
Figure 4:
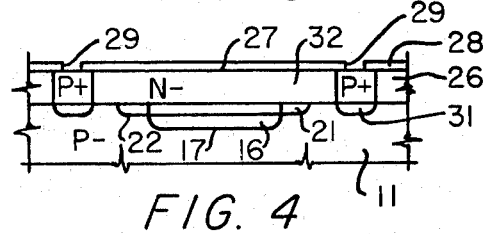
Figure 5:
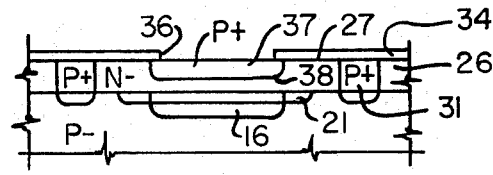
Figure 6:
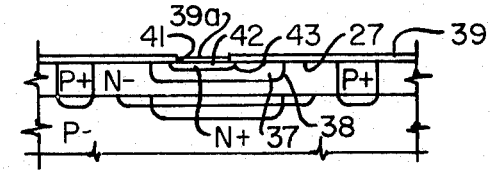

After completion of the steps shown in FIGS. 1 and 2, the oxide layer 18 is stripped and thereafter, a thin N-type epitaxial layer 26 is formed on the surface 12. The epitaxial layer can be grown from a thickness ranging from 2 to 5 microns, and preferably at a thickness of approximately 3 microns. A planar surface 27 is provided on the epitaxial layer and an insulating layer 28 formed of silicon dioxide is formed on the surface 27. Openings 29 are formed in the silicon dioxide layer and a P-type impurity is diffused through the openings 29 to provide P+ posts or regions 31 which extend through the N-type epitaxial layer 26 down into the P− substrate or semiconductor body 11 to provide islands or isolated regions 32 which are isolated from each other.

The oxide layer 23 is then stripped and another layer 34 is regrown on the surface 27. Openings 36 are formed in the layer 34 to expose the surface 27 immediately overlying the P+region 16. A P+ impurity is then diffused through the openings 36 to provide P+ regions 37 which are defined by PN junctions 38 which extend to the surface 27. After the region 37 has been formed, the oxide layer 34 is stripped away and another oxide layer 39 is grown on the planar surface 27. Openings 41 are formed in the layer 39 to expose the surface 27 and thereafter a suitable N-type impurity such as phosphorus is diffused through the openings 41 to provide N+ emitter regions 42 disposed within the P+ region 37 and which are defined by dish-shaped PN junctions 43 extending to the surface 27. It will be noted that no collector access windows have been provided in the oxide layer 39. During diffusion of the emitter regions 42, a thin oxide layer 39a will regrow in the opening 41.

In the formation of the base regions 37 and the emitter regions 42, it is desirable that the formation of these regions be accurately controlled. Although this may be accomplished by the use of diffusion techniques, it is preferable to utilize ion implantation techniques because of the greater ease of obtaining the desired accuracy. In this way, the concentration in the base region as well as the base width ($B_W$) can be readily controlled.

After the emitter regions 42 have been formed, the base and emitter openings 47 and 48 respectively are then formed in the oxide layer 39 to expose the surface 27 in areas overlying the base and emitter regions 37 and 42. Thereafter, a layer of metal is deposited on the insulating layer 39 which extends through the openings 47 and 48 to make contact to the base and emitter regions 37 and 42. Conventional photolithographic techniques are then utilized to remove the undesired portions of the metal layer so that three remains leads 49 and 51 making contact to the base and emitter regions 37 and 42 as shown in FIG. 7 with no contact being made to the collector region.

Figure 7:
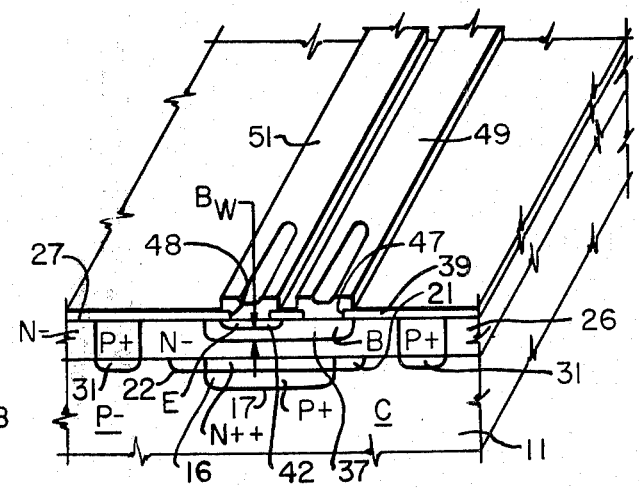
FIG. 7 is an isometric view, partially in cross-section, of a completed single bipolar transistor memory cell.
Figure 8:
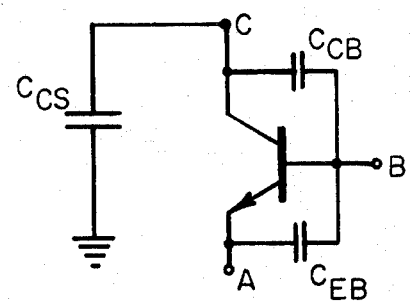
FIG. 8 is a schematic circuit diagram of the single bipolar transistor memory cell.

In FIG. 8 there is shown in equivalent circuit of the structure shown in FIG. 7 which includes the parasitic capacitances. Parasitic resistances and parallel diode equivalents have been omitted. As can be seen, the device is basically a transistor with the collector to base parasitic capacitance identified as $C_{CB}$ and the emitter-base parasitic capacitance represented by $C_{EB}$. Access to the collector is not obtained by a separate contact from the top side extending through the oxide layer 39 and contacting the surface 27. However, one terminal of the collector substrate capacitance identified as $C_{CS}$ is connected internally through the region 16 to the common substrate or body 11, whereas the other terminal is the region 21.

The basic operation of the single transistor memory cell may now be briefly described as follows. With the base at a fixed level and the capacitance $C_{CS}$ discharged, the emitter is moved to a positive voltage. As the voltage on the emitter exceeds the threshold set by curve 1 in FIG. 9A and the base is fully depleted, the charging of the capacitance $C_{CS}$ will start. The capacitance $C_{CS}$ will charge to a voltage given by the applied voltage less the voltage drop across the base. After the capacitance $C_{CS}$ is charged to a required level, the voltage level on the emitter is lowered to the same potential as the base, the charge on the capacitance $C_{CS}$ will be isolated from the emitter contact by the depletion layer formed around the metallurgical collector-base junction. This effectively locks the charge on the collector to substrate capacitance $C_{CS}$ which is made intentionally large by the inclusion of the P+ layer 16 which is near the N++ layer 21. The "locking" of the charge on the capacitor $C_{CS}$ may be considered as storing of information of one kind, i.e., a logical "1" or an analog value. The charge on the capacitance $C_{CS}$ will leak off at a very low rate typical of a back biased diode.

The removal of the charge from the capacitor $C_{CS}$ is accomplished by lowering the voltage on the emitter below the base voltage; or conversely, elevating the base voltage above the emitter voltage. Charge removal is accelerated by the current gain of the cell acting as an NPN transistor. The removal of the charge may be considered analogous to restoring of a lower reference level, i.e., the storing of a logical "0"or storing a reference line for an analog quantity.

Thus, it can be seen that a single transistor memory cell of this type is capable of storing a digital as well as an analog quantity. This can be accomplished by accessing the cell with only two contacts, i.e., the emitter and base contacts hereinbefore described.

Figure 9A:
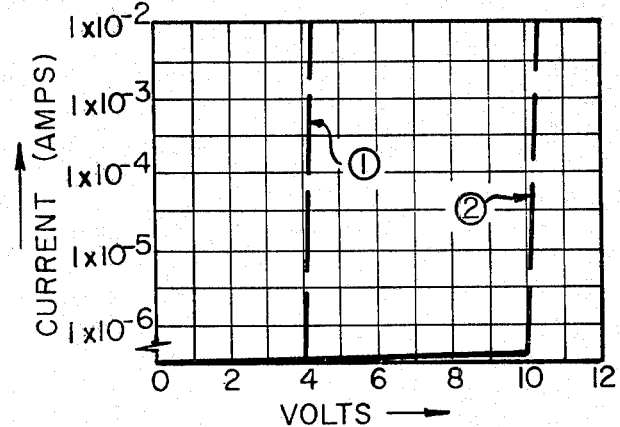
FIG. 9A is a graph showing V-I transfer characteristics of a single bipolar transistor memory cell for first and second sets of conditions.

In FIG. 9A, the curve 1 represents the V-I transfer characteristics between the emitter contact and collector contact with the base contact floating. A positive polarity is applied to the emitter. The curve 2 of the same FIG. 9A represents the V-I transfer characteristics between emitter and base with the collector floating and again with a positive polarity applied to the emitter. Curve 2 of FIG. 9A represents the reverse emitter-to-base breakdown which is set mainly by the surface base concentration at the intersection with the emitter. Curve 1 of FIG. 9A has a more complex origin. The impurity concentration and the base width identified as $B_W$ in FIG. 7 have been adjusted so that at approximately 4 volts of reverse bias, the base region is fully depleted of mobile carriers. The emitter is highly doped and thus the depletion layer moves only slightly into the emitter from the emitter-base junction. The line 1 in FIG. 9A represents a voltage given by the integral of the electric field in the base region as specified by the Poisson's relationship.

Figure 9B:
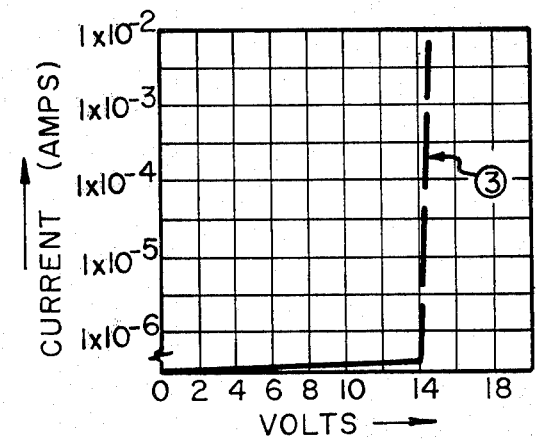
FIG. 9B is a graph showing V-I characteristics of a single bipolar transistor memory cell for a third set of conditions.

If it were possible to bias the collector positively with respect to the emitter, the depletion layer would spread both ways from the collector-base metallurgical junction and with a lightly doped collector, and the base floating, the breakdown voltage between the collector and the emitter would be greater than the emitter-to-collector breakdown voltage. Thus, the magnitude of breakdown voltage is dependent upon the polarity of the applied voltage and this "asymmetry" is basic to the operation of the present memory cell. The approximate value of the collector-emitter breakdown voltage is shown in curve 3 in FIG. 9B.

It should be appreciated that the transfer characteristics which are shown are only typical values which have been selected to demonstrate the principles of operation of the memory cell.

Basically, in the memory cell the collector to substrate capacitance of an NPN transistor is used as a storage element. A portion of the base during operation is operated in a fully depleted mode, thus in a precisely controlled way reducing the emitter-to-collector reverse breakdown voltage. Also crucial to the operation of the memory cell is the fact that collector-to-emitter reverse breakdown voltage is larger than the emitter-to-collector reverse breakdown voltage. It also follows that the emitter-to-base reverse breakdown voltage with the collector floating is greater than the previously mentioned emitter-to-collector voltage with base floating. In operation, bias is applied to the transistor so as to achieve an emitter-base breakdown. However, before the emitter-base breakdown is achieved, the base is so lightly doped that it punches through and the depletion region reaches into the collector. This voltage is relatively low as is shown by line 1 in FIG. 9A. Thus, in producing the base, it is seen that the concentration should be such that it punches through or depletes completely at a low voltage. As the base is depleted and a more positive potential is applied to the emitter, the capacitance $C_{CS}$ tends to receive current and charge up to comply with the condition. The capacitance $C_{CS}$ will charge up to such a voltage less the punch-through voltage or the voltage supported by the N++ P+junction 38. When the voltage has risen to a satisfactory level, the emitter is brought down to the same voltage level as the base. The accumulated charge on the capacitance $C_{CS}$ acts as a voltage source and it effectively looks to the collector-base junction as if the collector was positively charged. Therefore, the depletion layer starts to form between the metallurgical junction (P+ and N− junction). The depletion layer will spread in part into the P+ region 37 of the substrate 11 but will spread a larger distance into the N− region 26. The voltage the collector-base PN junction can support is given by Poisson's relationship which is the integral of the electric field over the total depletion region surrounding the junction, and for that reason the voltage which can be supported by the junction is greater when the depletion layer is spread about the base-collector PN junction than when spread about the base-emitter PN junction. This greater voltage will maintain the charge on the capacitance $C_{CS}$.

Thus, it can be seen that the memory cell is capable of assuming two stable states. It is a dynamic device which is capable of assuming these two stable states by operating a portion of the base in fully depleted mode and in this way reducing the emitter-to-collector reverse breakdown voltage. The capacitance $C_{CS}$ can be charged through a low voltage because of the depletion in the base region and then maintained in this charged condition by causing a spreading of the depletion layer around the N+P− junction. This charge on the capacitance will be stored and will only leak off at a rate determined by the reverse bias of the N+P− junction. This is one stable state and can correspond to a "1". If it is desired to discharge the capacitance $C_{CS}$, the emitter is brought below the base and through the current gain the charge on the capacitance $C_{CS}$ is discharged.

There are a number of ways in which the condition of the memory cell can be sensed. For example, a voltage can be placed on the charge line and if current flows, it is known that the memory cell does not contain a charge which would be equivalent to a "0". If there is no current flowing at the application of such a voltage, the capacitance $C_{CS}$ is charged and this would be equivalent to a "1". This is called the principal writing and reading. Alternatively, this can be stated as storing a quantity and then sensing the quantity stored. The principal novelty in the present memory cell lies in the fact that the depletion mode of the base is being utilized to store the charge and to retain the charge. For charging the device, the depletion mode with respect to the N+ is utilized. The charge is stored by depleting the base with respect to N−. In addition, there is provided the P+ layer under the N++ layer to enhance the capacitance $C_{CS}$.

The operation of the device also can be understood by analyzing the function of metallurgical junctions 43 and 38. When the depletion layer forms about the junction 43, only a small voltage can be supported by the depletion layer because of the N++ and the base punch-through nature of the junction. On the other hand, if the depletion layer is formed about junction 38, the depletion layer can support a greater voltage which is a characteristic of the P+N− junction. These two junctions correspond to a writing junction and a storing junction, respectively.

From the foregoing, it can be seen that there has been provided a memory cell which utilizes the storage capability of a transistor by increasing the substrate capacitance. This is contrary to the usual practice in which it is desirable to provide a transistor with as little capacitance as possible. The collector-substrate capacitance is increased by adding the P+ and N+ regions 16 and 21, respectively. A controlled deposition of impurities in the base region to a low level is utilized so that the voltage in the depletion mode with a fully depleted base is low. A unique charging mechanism is utilized for charging the collector-substrate capacitance through a low voltage drop. In addition, it is locked in the charge condition by a high voltage drop. A distinct advantage is the fact that only two leads are required to charge and discharge the storage. By placing these two leads on X-Y coordinates, it is possible to select one device out of a row and column for the purposes of writing and storing. In other words, there has been provided a single cell memory element which is bipolar in nature which requires only two contacts. It is a dynamic memory cell and takes advantage of the vertical geometry of the device. Since the structure of the memory cell is truly bipolar in nature, it is compatible with bipolar production techniques. Conventional diffusion type isolation may be utilized.

It is apparent from the foregoing that there has been provided a memory cell and method for fabricating the same which have many advantages as outlined above. The memory cell should be significantly smaller then conventional memory cells, for example, a 1024 memory chip can be provided which would have a dimension no greater than 70 to 75 mils on the side which would represent at least a 30% reduction in size over a conventional chip.

We claim:

1. In a single bipolar transistor memory cell, a semiconductor body of one conductivity type forming a substrate and having a surface, an epitaxial layer of opposite conductivity type formed on said surface and providing a collector region and having a planar surface parallel to the surface of the semiconductor body, a buried layer of said one conductivity type extending into said semiconductor body from the surface of the semiconductor body, a base region of said one conductivity type formed in said epitaxial layer and extending downwardly from the surface of the epitaxial layer and being defined by a first generally dish-shaped PN junction extending to the surface of the epitaxial layer, an emitter region of opposite conductivity type formed in said base region and being defined by a second generally dish-shaped PN junction extending to the surface of the epitaxial layer, the collector to emitter connected reverse breakdown voltage of a given polarity being greater than the oppositely connected emitter to collector reverse breakdown voltage, a layer of insulating material overlying said surface of said epitaxial layer, and metallization on said surface and extending through said insulating material and making contact solely to said base and emitter regions so that the cell is only accessed with two contacts, one a base contact and the other an emitter contact, said bell having a collector-base parasitic capacitance identified as $C_{CB}$ and an emitter-base parasitic capacitance identified as $C_{EB}$, said cell also having a collector-substrate capacitance identified as $C_{CS}$, means for applying a voltage between the base and emitter with respect to the substrate so that the voltage between the emitter and substrate is greater than that on the base to cause reverse breakdown from collector to emitter for charging of the capacitance $C_{CS}$, when the base is substantially fully depleted of mobile charges to a value given by the voltage applied between the emitter and substrate less the voltage drop across the depleted base, thereafter lowering the voltage applied between the emitter and base to approximately that of the base to cause the charge on the capacitance $C_{CS}$ to be isolated from the emitter by the formation of a depletion layer at the collector-base junction, and thereafter applying a voltage between the base and emitter so that the voltage on the base is above that on the emitter causing forward collector to emitter current to remove the stored charge from the capacitance $C_{CS}$.

2. A memory cell as in claim 1 together with isolation means formed in said epitaxial layer and extending through said epitaxial layer to isolate said memory cell from other devices carried by the semiconductor body.

3. A memory cell as in claim 1 wherein said base and emitter regions overlie said buried layer and wherein said buried layer has a size approximating that of the base region.

4. A memory cell as in claim 1 together with an additional layer of opposite conductivity type formed in the semiconductor body and extending downwardly into the semiconductor body from the surface of the semiconductor body and being in general alignment with the buried layer and having a depth less than that of the buried layer to provide a PN junction generally underlying the base region which can be utilized for enhancing the collector to substrate capacitance.

5. In a bipolar transistor memory cell, a semiconductor body of one conductivity type having a surface, a buried layer of said one conductivity type extending into the semiconductor body from the surface of the semiconductor body, an additional layer of opposite conductivity type formed in the semiconductor body and extending downwardly into the semiconductor body from the surface of the semiconductor body having a depth less than that of the buried layer and overlapping said buried layer to form a buried PN junction therebetween, an epitaxial layer of opposite conductivity type formed on said surface and having a planar surface parallel to the surface of the semiconductor body to form a collector region generally overlying said PN junction, said collector region having a corresponding capacitance $C_{CS}$ with respect to said semiconductor body, a base region of said one conductivity type formed in said epitaxial layer and extending downwardly from the surface of the epitaxial layer and being defined by a first generally dish-shaped collector to base PN junction extending to the surface of the epitaxial layer said collector to base junction having a corresponding depletion layer, an emitter region of opposite conductivity type formed in said base region and being defined by a second generally dish-shaped base to emitter PN junction extending to the surface of the epitaxial layer, a layer of insulating material overlying said surface of said epitaxial layer and metallization on said surface and extending through said insulating layer and making contact solely to said base and emitter regions so that the cell is only accessible with the emitter and base contacts so that when a first predetermined emitter to base voltage polarity with respect to said body is applied to the capacity $C_{CS}$ is charged by reverse breakdown and when a second emitter to base voltage polarity is applied said depletion layer isolates capacity $C_{CS}$ and the charge thereon is retained.

* * * * *